United States Patent [19]

Cowley

[11] Patent Number: 4,862,515
[45] Date of Patent: Aug. 29, 1989

[54] FREQUENCY DIVIDING ARRANGEMENTS

[75] Inventor: Nicholas P. Cowley, Wiltshire, England

[73] Assignee: Plessey Overseas Limited, Ilford, England

[21] Appl. No.: 19,276

[22] PCT Filed: Jun. 18, 1986

[86] PCT No.: PCT/GB86/00351
§ 371 Date: Apr. 9, 1987
§ 102(e) Date: Apr. 9, 1987

[87] PCT Pub. No.: WO87/00365
PCT Pub. Date: Jan. 15, 1987

[30] Foreign Application Priority Data

Jun. 25, 1985 [GB] United Kingdom ............... 8516005

[51] Int. Cl.$^4$ ............................................. H04B 1/10
[52] U.S. Cl. .................................... 455/183; 455/264; 455/317
[58] Field of Search ............... 455/183, 208, 216, 255, 455/260, 264, 114, 165, 209, 257, 259, 295, 326, 296, 307, 317

[56] References Cited

U.S. PATENT DOCUMENTS

| 4,068,199 | 1/1978 | Madoff | 455/216 |
| 4,517,531 | 5/1985 | Tan et al. | 455/260 |
| 4,521,916 | 6/1985 | Wine | 455/260 |
| 4,542,533 | 9/1985 | Parker | 455/183 |
| 4,556,998 | 12/1985 | Yoshisato | 455/183 |
| 4,679,246 | 7/1987 | Jeng | 455/183 |

FOREIGN PATENT DOCUMENTS 0131337 1/1985 European Pat. Off. ............ 455/317

OTHER PUBLICATIONS

"IBM Technical Bulletin", 3/85, p. 1.
"A Novel Approach to Digitally Controlled PLL Tuning Systems", 8/82, Pierce et al, FIG. 1.
Satellite TV Applications; Plessey Semiconductors; Preliminary Information; SP5050/1; pp. 43–48.

Primary Examiner—Robert L. Griffin
Assistant Examiner—Curtis Kuntz
Attorney, Agent, or Firm—Fleit, Jacobson, Cohn, Price, Holman & Stern

[57] ABSTRACT

A frequency dividing arrangement 5 comprises a frequency divider 6 coupled to an active filler 7 which is operative to suppress output radiation from the frequency dividing arrangement. The arrangement 5 may be incorporated into a frequency synthesis loop 4 of a television tuner circuit in order to reduce interference between the loop 4 and a down conversion stage of the tuner circuit.

4 Claims, 3 Drawing Sheets

FREQUENCY DIVIDING ARRANGEMENTS

This invention relates to frequency dividing arrangements, and in particular to frequency dividing arrangements which are suitable for use in tuners.

Frequency dividing arrangements, and in particular frequency dividing arrangements suitable for use in television tuning equipment typically comprise an input radio frequency amplifier followed by cascaded divide by two and divide by four elements which are realised in Emitter Coupled Logic (ECL) technology. The final dividing stage drives an output stage which interfaces with external circuitry. The output stage may be of ECL or transistor transistor logic (TTL) format, the ECL format producing balanced ECL type logic outputs by means of a differential transistor pair stage, and the TTL format being conventional TTL signal levels and circuitry. The differential transistor pair stage, by virtue of its gain, toggles rapidly and so produces a substantially square wave output which is very rich in harmonics.

Such frequency dividing arrangements are problematic in that they radiate electromagnetic signals at the harmonic frequencies of the square wave produced by the frequency dividing arrangement, which electromagnetic signals interfere with other circuitry in the vicinity of the frequency dividing arrangement.

The radiation of such electromagnetic signals is particularly disadvantageous when the frequency dividing arrangement is incorporated in a television tuner which also contains some intermediate frequency (IF) circuitry. This is because radiated signals having frequencies at harmonic frequencies at or near to the intermediate frequencies (such as 40 MHz) can be received by the IF circuitry within the tuner which leads to interference in the IF signal and distortion of the video picture.

It is an intention of the present invention to provide a frequency dividing arrangement which may be incorporated into a circuit arrangement and which reduces interference caused by electromagnetic signals radiated by the frequency dividing arrangement.

According to the present invention there is provided a frequency dividing arrangement for inclusion in a circuit arrangement, wherein the frequency dividing arrangement comprises a frequency divider coupled to an active filter, the active filter being operative to suppress output radiation from the frequency dividing arrangement.

The frequency dividing arrangement may form a whole or part of an integrated circuit.

According to the present invention there is further provided a tuner comprising a down conversion stage for providing an intermediate frequency signal in dependence upon a radio frequency signal received by the tuner and a local oscillator signal, and a frequency synthesiser means for generating the local oscillator signal, wherein the frequency synthesiser means includes a frequency dividing arrangement comprising a frequency divider coupled to an active filter, the active filter being operative to suppress output radiation from the frequency dividing arrangement.

The down conversion stage preferably comprises a mixer for mixing the radio frequency signal with the local oscillator signal to produce the intermediate frequency signal, and the frequency synthesiser means preferably comprises a voltage controlled oscillator for generating the local oscillator signal and a feedback signal which is afforded to a phase or frequency comparator via the frequency dividing arrangement, which phase or frequency comparator is arranged for providing a control signal for the voltage controlled oscillator in dependence upon a difference in phase or frequency between a reference signal and a feedback signal afforded thereto from the frequency dividing arrangement.

The invention will now be further described by way of example, with reference to the accompanying drawings, in which.

Figure 1:
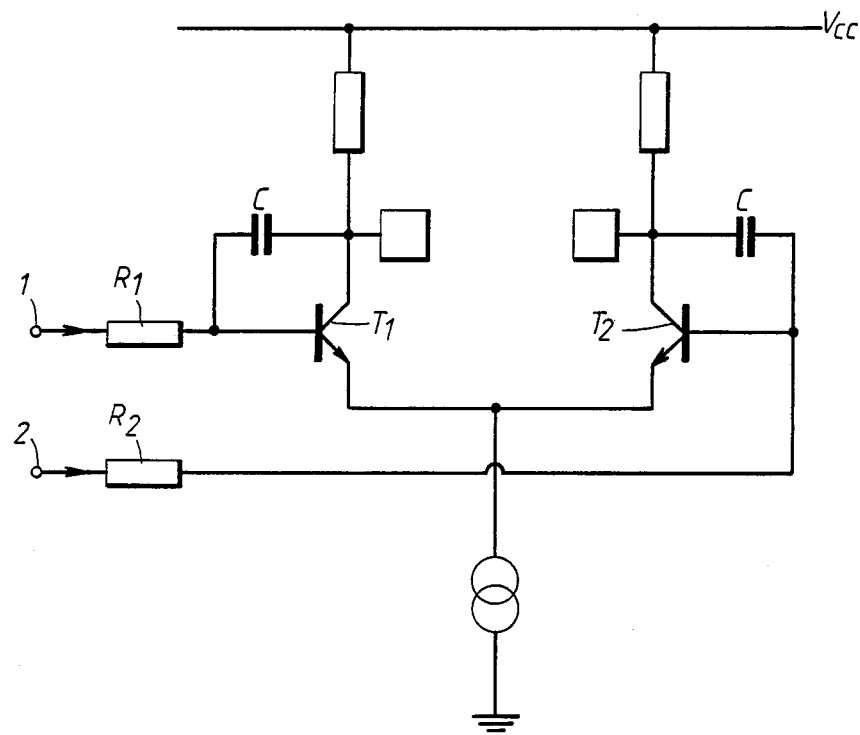
FIG. 1 is a circuit diagram of a output stage of a prior art frequency dividing arrangement.

FIG. 1 is a circuit diagram of a prior art output stage of a frequency divider (not shown). The output stage comprises a long tail pair having transistors $T_1$ and $T_2$. The base electrodes of the transistors $T_1$ and $T_2$ are coupled to respective output terminals 1 and 2 of the final dividing stage of the frequency divider via resistors $R_1$ and $R_2$. The base electrode of each of the transistors $T_1$ and $T_2$ is coupled to the respective collector electrode via a capacitors C. The capacitors C and the resistors $R_1$ and $R_2$ are operative, in conjunction with the long tail pair, to slew rate limit the output of the frequency divider. However, the extent of slew rate limiting with this output stage is restricted and hence the degree of suppression of unwanted harmonics is also restricted.

An additional disadvantage with this output stage is that an external high order passive filter is required in order to attenuate unwanted signals thereby to reduce output radiation from the frequency divider, and the passive filter cannot be fabricated in integrated circuit form. A further disadvantage with the passive filter is that it leads to attenuation of wanted signals which has to be compensated for in the frequency divider output stage by an increase in output swing accompanied by a decrease in output impedance in order that better matching into the filter be achieved.

Figure 2:
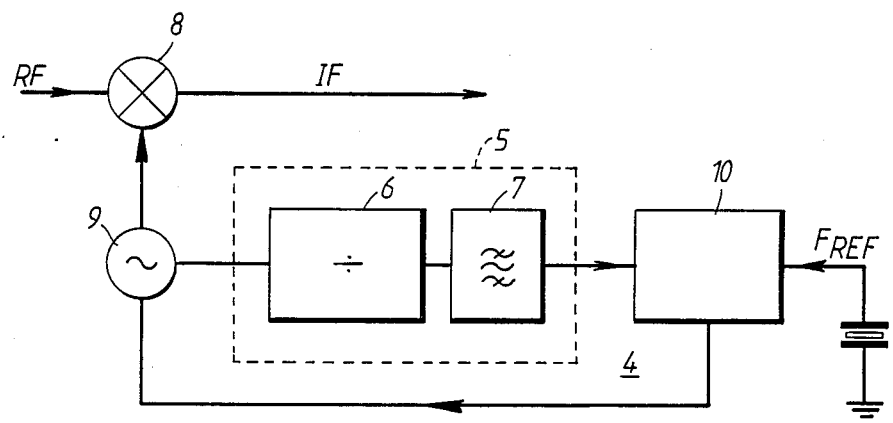
FIG. 2 is a schematic diagram of a television tuner which includes a frequency dividing arrangement according to the present invention.

Referring now to FIG. 2, there is shown a schematic diagram of a television tuner which includes a frequency dividing arrangement embodying the present invention. The tuner comprises a frequency synthesis loop 4 which includes a frequency dividing arrangement 5.

The frequency dividing arrangement 5 comprises a frequency divider 6, which may be a known type of divide by N high speed prescaler, where for example N equals 64 or 256, coupled to an $n^{th}$ order active filter 7.

An active filter is a filter which contains an active element, for example, a component arranged to provide gain. The 'order' of an active filter is a measure of how rapidly the attenuation of the filter increases with frequency.

The $n^{th}$ order active filter 7, a specific example of which is described with reference to FIG. 3 where n=3, can be fabricated onto the same integrated circuit chip as the frequency divider 6. The active filter 7 is operative to attenuate signals at intermediate frequencies (IF) thereby suppressing the radiation of electromagnetic waves from the frequency dividing arrangement 5.

The tuner shown in FIG. 2 comprises a down conversion stage for providing an IF signal in dependence upon a radio frequency (RF) signal received by the tuner and a local oscillator signal. The down conversion stage includes a mixer 8 for mixing the RF signal with the local oscillator signal to produce use the IF signal. The frequency synthesis loop 4 generates the local oscillator signal and comprises a voltage controlled oscillator 9 for generating the local oscillator signal and a feedback singal which is afforded to a phase comparator 10 via the frequency dividing arrangement 5. The phase comparator 10 includes a means which provides a control signal for the voltage controlled oscillator 9 in dependence upon a difference in phase between a reference signal $F_{ref}$ and the feedback signal.

The phase comparator 10 further comprises a programmable multimodulus divider (not shown) in the feedback signal path and a reference divider (not shown) in the reference signal path.

The phase comparator 10 may be replaced by a frequency comparator (not shown) in a case where the control signal is provided in dependence upon a difference in frequency between the reference signal $F_{ref}$ and the feedback signal.

Since the active filter 7 is operative to suppress output radiation, particularly at IF frequencies, interference between the frequency synthesis loop 4 and IF circuitry of the tuner is reduced.

Figure 3:
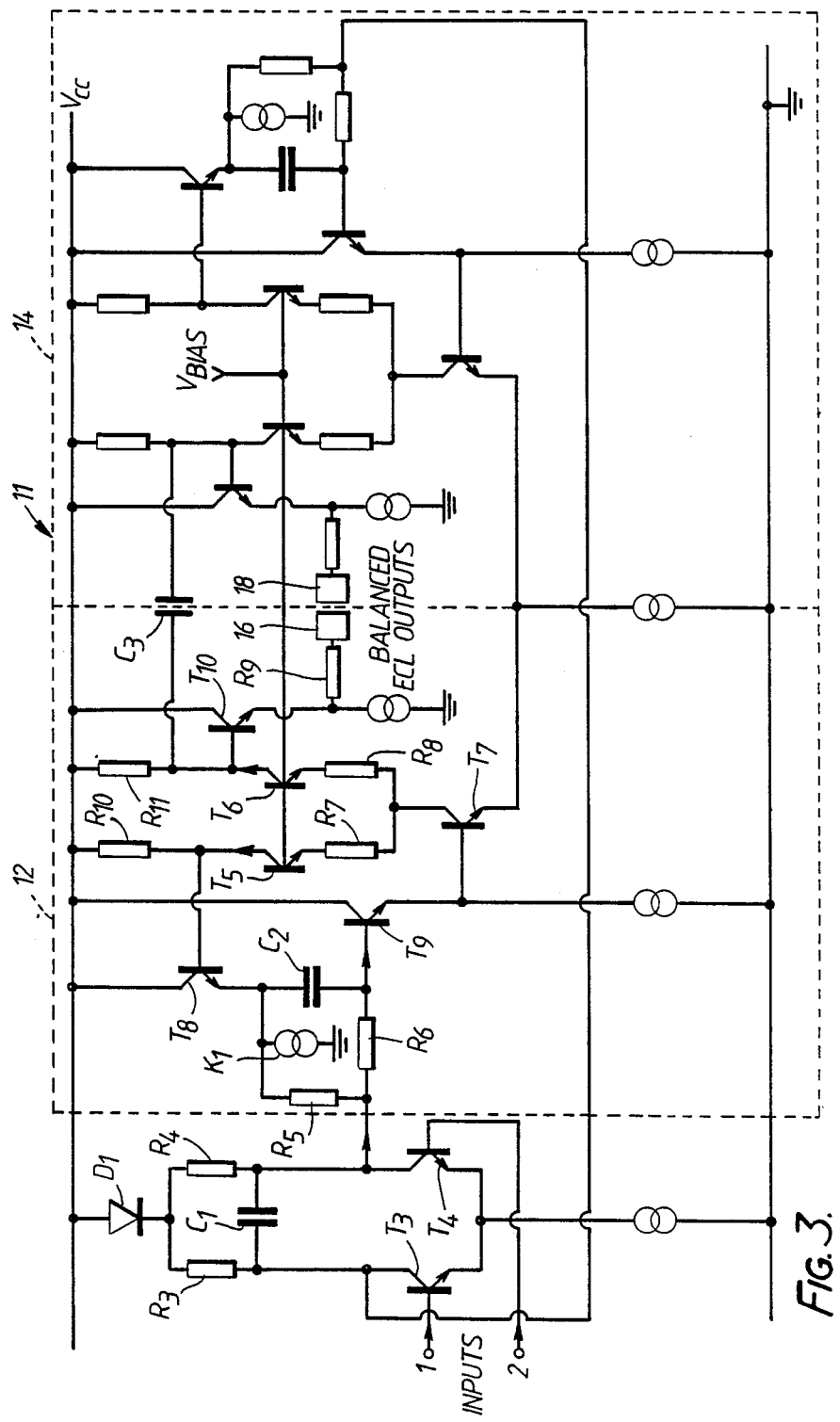
FIG. 3 is a circuit diagram of a preferred form of active filter.

FIG. 3 shows a circuit diagram of a third order active filter 11 which may be coupled to the frequency divider 6 of the frequency dividing arrangement 5. The third order active filter 11 receives frequency divided input singals from the frequency divider 6 via input terminals 1 and 2. The third order active filter 11 comprises a long tail pair, having a pair of transistors $T_3$ and $T_4$ which are switched by the frequency divided input signal. The collector electrodes of the transistors $T_3$ and $T_4$ are connected to a voltage rail $V_{CC}$ via a filter network comprising resistors $R_3$, $R_4$ and a capacitor $C_1$, and a diode $D_1$ provided for direct current (d.c.) voltage matching. The third order active filter 11 also comprises a pair of complementary circuit networks 12 and 14 which provide complementary filtered output signals at respective bonding pads 16 and 18. The circuit networks 12 and 14 are similar to one another and so only the circuit network 12 will be described below with reference to FIG. 3.

The collector electrode of the transistor $T_4$ affords an output signal which is fed to a feedback network comprising a pair of resistors $R_5$, $R_6$, a capacitor $C_2$ and a constant current source $K_1$. The feedback network is coupled to a cascode comprising a pair of transistors $T_5$, and $T_6$ and a pair of resistors $R_7$ and $R_8$ via a gain stage amplifier $T_7$ and $R_{10}$ and unity gain follower transistors $T_8$ and $T_9$. The collector electrode of the transistor $T_6$ of the cascode is connected to $V_{cc}$ via a resistor $R_{11}$.

A capacitor $C_3$, which couples the resistor $R_{11}$ to the corresponding resistor in the circuit network 14, is operative in conjunction with the resistor $R_{11}$ and the cascode to provide further filtering of the output signal which is afforded at the bonding pad 16 via an emitter follower transistor $T_{10}$ and a resistor $R_9$.

The particular component values are chosen so that the active filter 7 attenuates unwanted frequencies which may give rise to output radiation and which may interfere with other parts of the circuit in which the frequency dividing arrangement is situated.

Figure 4:
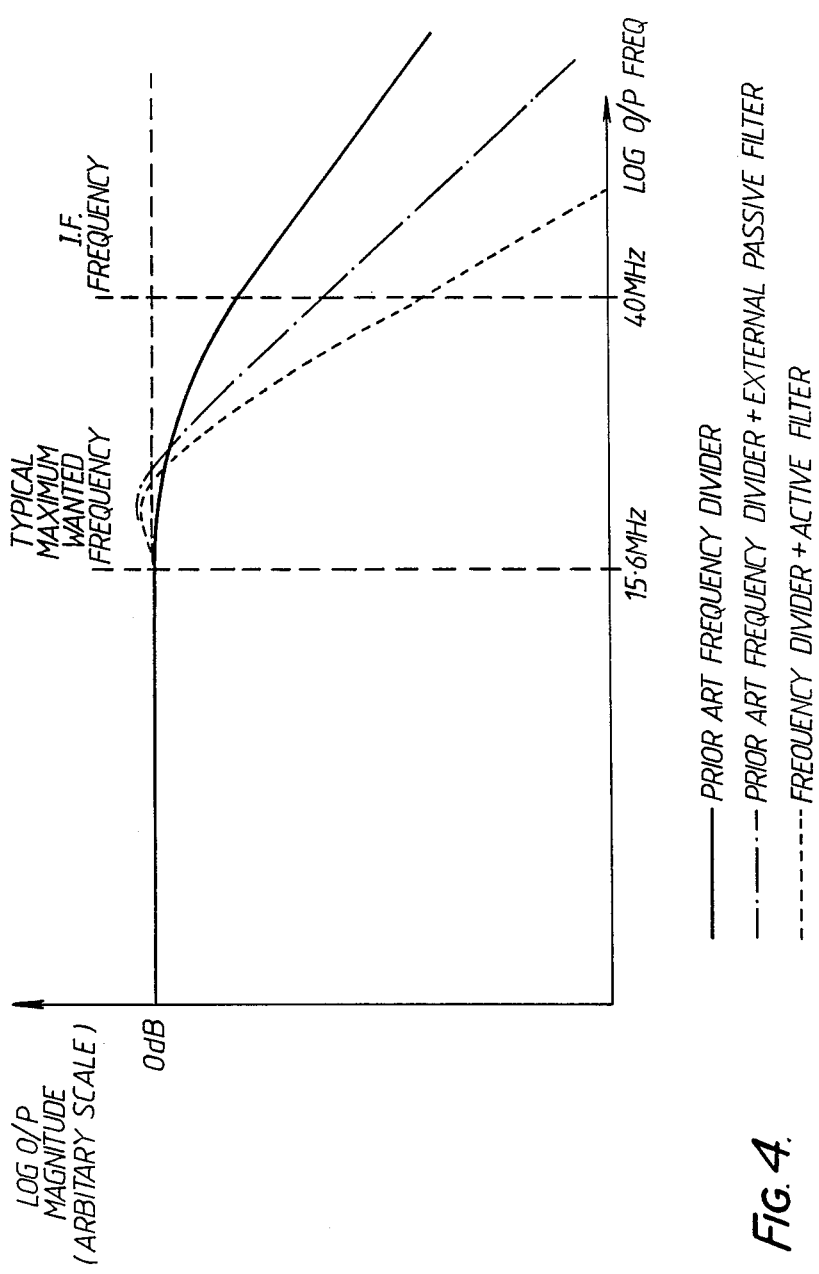
FIG. 4 is a Bode plot illustrating attenuation characteristics of a preferred embodiment of the present invention and comparing them with characteristics of prior art frequency dividing arrangements.

FIG. 4 shows a Bode plot illustrating the attenution characteristics of the third order active filter 11 as compared with a prior art frequency divider and a prior frequency dividing arrangement which includes an external passive filter.

I claim:

1. A tuner for providing an intermediate frequency signal in dependence on an input radio frequency signal and a local oscillator signal, including mixer means for mixing the input radio frequency signal with the local oscillator signal to produce the intermediate frequency signal; a frequency synthesizer generating the local oscillator signal, comprising: a voltage controlled oscillator connected to the mixer means transmitting thereto the local oscillator signal; a frequency dividing arrangement connected in a feedback loop to the voltage controlled oscillator transmitting a feedback signal therefrom; a source of a reference signal; comparison means coupled to the frequency dividing arrangement and said reference signal source for providing a control signal to the voltage controlled oscillator in dependence upon a difference between said reference signal and the feedback signal from the frequency dividing arrangement; the frequency dividing arrangement comprising a frequency divider connected to the voltage controlled oscillator and low pass filter means coupling the frequency divider to the comparison means for severely attenuating harmonic signals from the frequency divider to prevent radiation interference with establishment of the intermediate frequency signal.

2. The Frequency dividing arrangement as set forth in claim 1 wherein the frequency divider and the low pass filter means are incorporated in a single integrated circuit chip.

3. In a frequency synthesizer for generating a signal of a desired frequency, including a voltage controlled oscillator providing a signal of controlled frequency; a frequency dividing arrangement coupled to the voltage controlled oscillator and transmitting an output therefrom; a source of a reference signal; and comparison means coupled to the frequency dividing arrangement and the reference signal source for providing a control signal in dependence upon a difference between the reference signal and the output of the frequency dividing arrangement; the improvement residing in the frequency dividing arrangement having a frequency divider connected to the voltage controlled oscillator and active filter means connected to the frequency divider for severely attenuating harmonic signals transmitted by the frequency divider to prevent radiation interference with the generation of the desired frequency signal.

4. The frequency dividing arrangement as set forth in claim 3 wherein the frequency divider and the active filter means are incorporated in a single common integrated circuit chip.

* * * * *